US007242741B2

United States Patent
Ho

(10) Patent No.: US 7,242,741 B2
(45) Date of Patent: Jul. 10, 2007

(54) DELAY PHASE-LOCKED LOOP DEVICE AND CLOCK SIGNAL GENERATING METHOD

(75) Inventor: Heng-Chen Ho, Taipei (TW)

(73) Assignee: VIA Technologies, Inc., Taipei (TW)

( * ) Notice: Subject to any disclaimer, the term of this patent is extended or adjusted under 35 U.S.C. 154(b) by 792 days.

(21) Appl. No.: 10/365,179

(22) Filed: Feb. 12, 2003

(65) Prior Publication Data

US 2003/0219089 A1   Nov. 27, 2003

Related U.S. Application Data

(60) Provisional application No. 60/382,146, filed on May 21, 2002.

(51) Int. Cl.
  *H03D 3/24*   (2006.01)
(52) U.S. Cl. ................ 375/376; 375/373; 375/371; 375/354
(58) Field of Classification Search ............. 375/376, 375/373, 371, 354
  See application file for complete search history.

(56) References Cited

U.S. PATENT DOCUMENTS 5,633,608 A   5/1997   Danger

| 5,838,204 A | | 11/1998 | Yao |
| 6,044,122 A | * | 3/2000 | Ellersick et al. ............ 375/360 |
| 6,125,157 A | * | 9/2000 | Donnelly et al. ........... 375/371 |
| 6,147,561 A | | 11/2000 | Rhee et al. |
| 6,326,826 B1 | | 12/2001 | Lee et al. |

FOREIGN PATENT DOCUMENTS

| DE | 0460274 | 11/1990 |
| GB | 1146641 | 10/2001 |

* cited by examiner

*Primary Examiner*—Chieh M. Fan
*Assistant Examiner*—Anna Ziskind
(74) *Attorney, Agent, or Firm*—Volpe & Koenig PC

(57) ABSTRACT

A PLL device of a core logic chip includes a controlled delay circuit having a plurality of controlled delay lines interconnected in series and outputting therefrom a plurality of output clock signals in response to a reference clock signal; a phase detector for generating an adjusting signal according to a phase difference between the reference clock signal and the output clock signals; and a control circuit for asserting a plurality of control signals to the controlled delay lines, respectively, according to the adjusting signal in order to have the delay times of the output clock signals independently adjusted and outputted again by the controlled delay lines. The delay times of the output clock signals can be determined according to a distribution table and further tuned according to a circuitry and a layout of the core logic chip.

15 Claims, 12 Drawing Sheets

| m | sum0 | sum1 | Sum2 | Sum3 | CNT0 | CNT1 | CNT2 | CNT3 | delta0 | delta1 | delta2 | delta3 |
|---|---|---|---|---|---|---|---|---|---|---|---|---|
| 4n | n | 2n | 3n | 4n | n | n | n | n | 0 | 0 | 0 | 0 |
| 4n+1 | 1n+0.25 | 2n+0.5 | 3n+0.75 | 4n+1 | n | n | n+1 | n | +0.25 | +0.5 | 0 | 0 |
| 4n+2 | 1n+0.5 | 2n+1 | 3n+1.5 | 4n+2 | n | n+1 | n | n+1 | +0.5 | 0 | -0.25 | 0 |
| 4n+3 | 1n+0.75 | 2n+1.5 | 3n+2.25 | 4n+3 | n+1 | n+1 | n | n+1 | -0.25 | -0.5 | +0.5 | 0 |

Fig.4

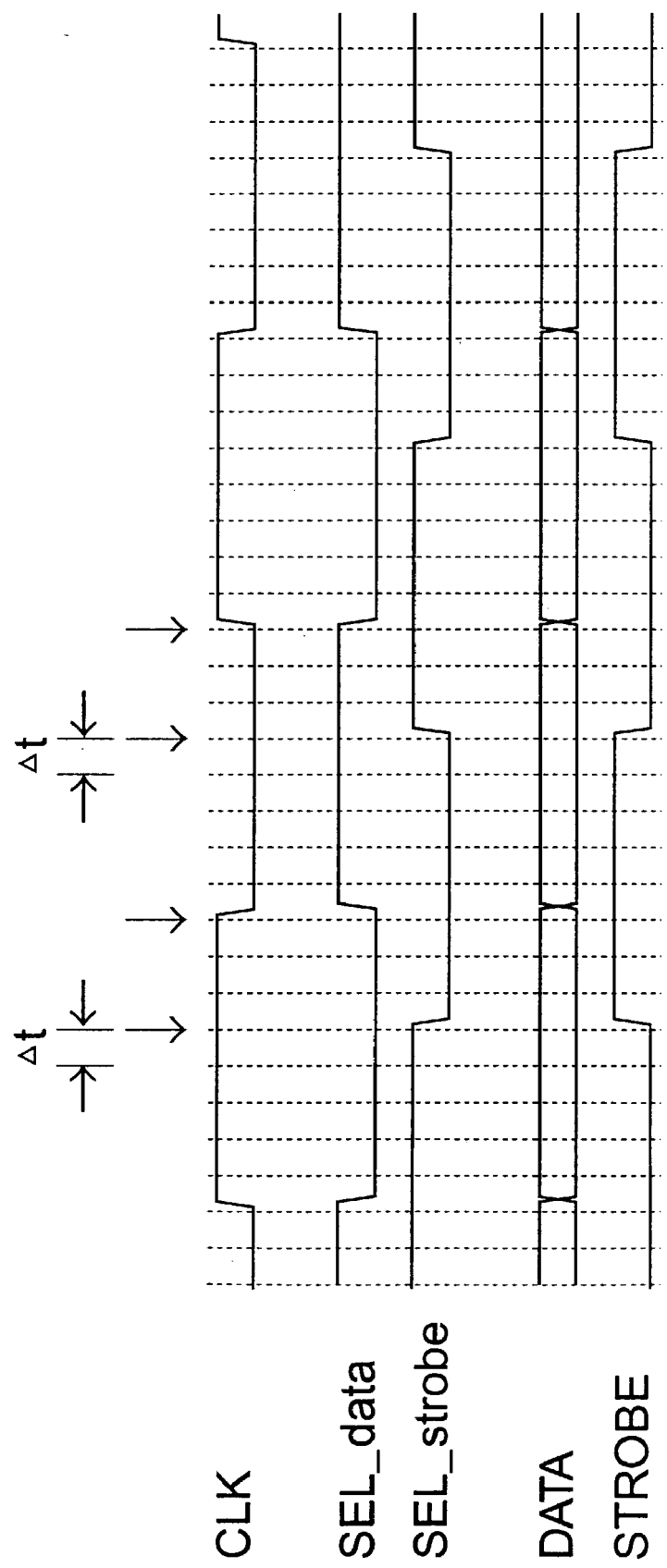

DELAY PHASE-LOCKED LOOP DEVICE AND CLOCK SIGNAL GENERATING METHOD

FIELD OF THE INVENTION

The present invention relates to a delay phase-locked loop (PLL) device and a clock signal generating method for use in a core logic chip.

BACKGROUND OF THE INVENTION

In a personal computer structure, in addition to the central unit processor (CPU), the core logic chip and the memory module have most effect on the data-processing performance. Please refer to FIG. 1A which is a schematic circuit block diagram showing the connection of a core logic chip and a memory module. With a double-date-rate (DDR) transmission specification, when the core logic chip 10 transmits a parallel data to the memory module 11, a strobe signal and a parallel data signal TX_D are transmitted to the memory module 11 simultaneously for facilitating the memory module 11 to read the data. The associated signals described as above is shown in FIG. 1B. Ideally, the rising edge or falling edge of each strobe signal is positioned right in the middle of a data bit of the parallel data signal TX_D, thereby assuring of correct data transmission.

In general, four output clock signals P0, P1, P2 and P3 with a phase difference of 90 degrees between every two adjacent signals, as shown in FIG. 2A, are required. A delay phase-locked loop (PLL) device can be used to achieve this purpose. Referring to FIG. 2B, the delay PLL device includes a controlled delay circuit 21, a phase detector 22 and a control circuit 23. The controlled delay circuit 21 consists of four delay lines 211, 212, 213 and 214, each of which comprises a plurality of delay units (not shown). A reference clock signal CLK is transmitted through and processed by the four controlled delay lines 211, 212, 213 and 214 to generate the four output clock signals P0, P1, P2 and P3. The four output clock signals have the phase difference of 90 degrees to each other. In order to keep in phase with the reference clock signal CLK, the output clock signal P0 is transmitted to the phase detector 22 along with the reference clock signal CLK. If the phase detector 22 detects an earlier phase of the reference clock signal CLK than the output clock signal P0, a counting-down adjusting signal is asserted. On the contrary, i.e. the phase of the reference clock signal CLK is later than that of the output clock signal P0, a counting-up adjusting signal is asserted. Once either of the adjusting signals is transmitted to the control circuit 23, a counted value CNT will be outputted to each of the controlled delay lines 211, 212, 213 and 214 by the control circuit 23 in response to the adjusting signal. The counted value represents the involving number n of delay units for each delay line. In other words, the delay time in each delay line can be controlled according to the counted value CNT.

For example, in the case that the phase of the reference clock signal CLK is earlier than that of the output clock signal P0, it means that the delay period effected by the controlled delay circuit 21 is too long. Thus the phase detector 22 asserts the counting-down adjusting signal, and the control circuit 23 outputs a counted value CNT=n−1 rather than CNT=n. In response to the reduced counted value, the delay period of each controlled delay line is simultaneously shortened, thereby adjusting the phase of the output clock signal.

The phases of the four output clock signals P0, P1, P2 and P3 are assured to be evenly distributed by 90-degree partition because the four controlled delay lines are imparted to the same counted value. Unfortunately, this will result in insufficient accuracy of signal delay because the phases are always adjusted by four delay units at one time. The insufficient accuracy may deteriorate the performance of the circuit particularly when the transmission rate is getting higher and higher. Further, in spite the parallel data signal TX_D initially generated by the source 101 according to the prior art is substantially perfect, the signals may be skewed or interfered to some extent when they have been outputted from the source 101 and forwarded to the I/O pad 102 via various transmission paths. Therefore, the strobe signal and parallel data signal outputted by the I/O pad 102 may have waveforms as shown in FIG. 2C rather than those shown FIG. 1B. That is, the rising edge and falling edge of the strobe signal may deviate from the middle position of the parallel data signal TX_D. Accordingly, errors may happen for the memory module 11 to receive data. This problem may be even serious when the transmission rate is getting higher and higher.

SUMMARY OF THE INVENTION

A first aspect of the present invention relates to a delay phase-locked loop (PLL) device for generating a plurality of output clock signals with different phases in response to a reference clock signal. The delay PLL device includes a controlled delay circuit including a plurality of controlled delay lines interconnected in series and outputting therefrom a plurality of output clock signals; a phase detector electrically connected to an output end of the controlled delay circuit, and generating an adjusting signal according to a phase relation between the reference clock signal and one of the output clock signals; and a control circuit electrically connected to the phase detector and the controlled delay lines, and asserting a plurality of control signals to the controlled delay lines, respectively, in response to the adjusting signal in order to have the delay time of the output clock signals independently adjusted and outputted again by the controlled delay lines.

A second aspect of the present invention relates to a delay phase-locked loop (PLL) device for use in a core logic chip. The delay PLL device includes a controlled delay circuit including a plurality of controlled delay lines interconnected in series and outputting therefrom a plurality of output clock signals in response to a reference clock signal; a phase detector electrically connected to an output end of the controlled delay circuit, and generating an adjusting signal according to a phase relation between the reference clock signal and one of the output clock signals; and a control circuit electrically connected to the phase detector and the controlled delay lines, and asserting a plurality of control signals to the controlled delay lines, respectively, in response to the adjusting signal in order to have the delay time of the output clock signals independently adjusted and outputted again by the controlled delay lines.

A third aspect of the present invention relates to a clock signal generating method. The method comprises steps of: receiving a reference clock signal; phase-delaying the reference clock signal to obtain a plurality of output clock signals with different phases; generating an adjusting signal according to a phase relation between the reference clock signal and one of the output clock signals with different phases; and independently adjusting the delay time of the output clock signals and outputting the adjusted output clock signals.

BRIEF DESCRIPTION OF THE DRAWINGS

The present invention may best be understood through the following description with reference to the accompanying drawings, in which:

FIG. 4 is a table for use in a clock signal generating method according to an embodiment of the present invention;

FIGS. 6A~6C are three examples for illustrating the clock signal generating method of the present invention.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 3:
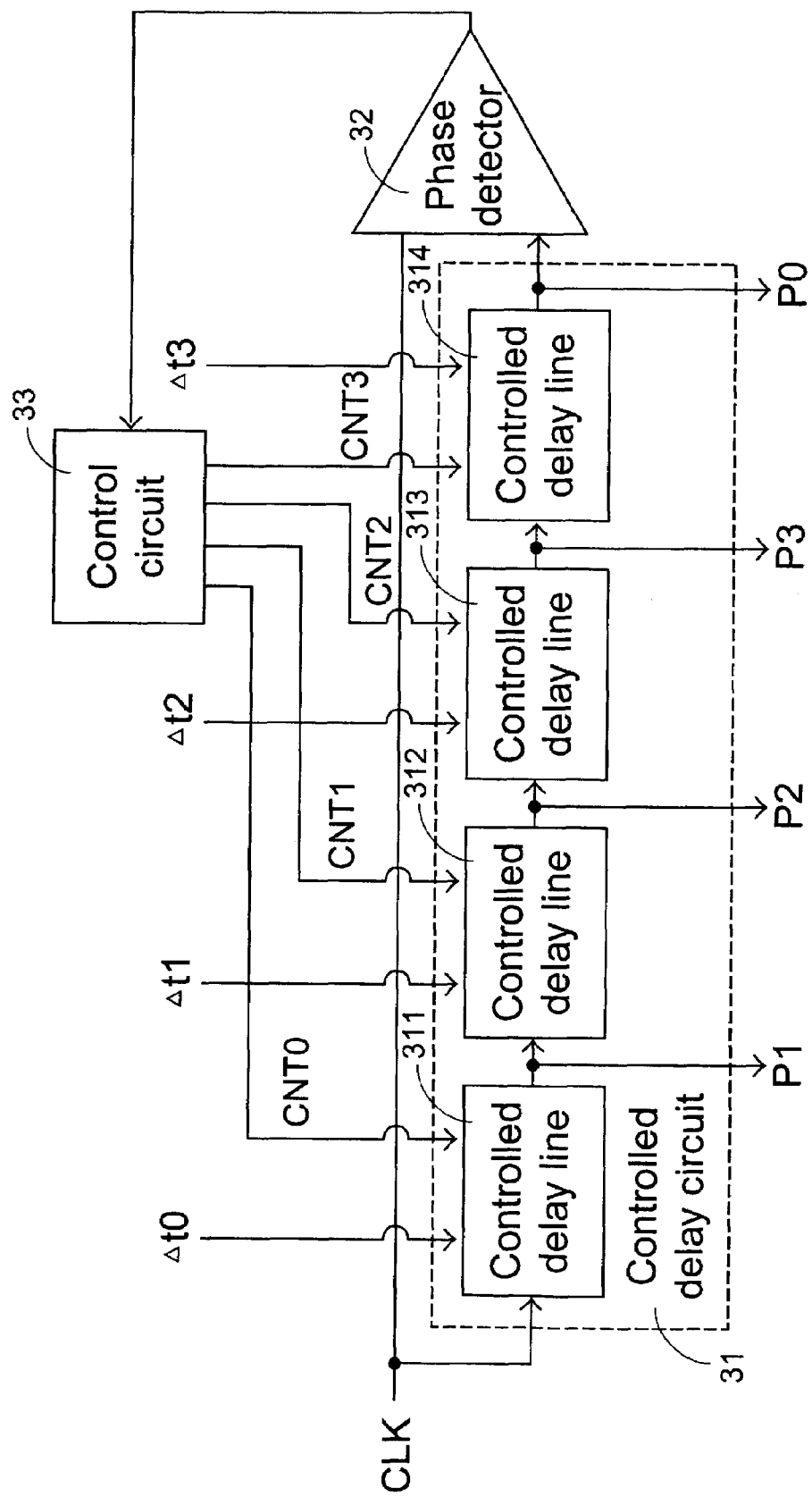
FIG. 3 is a schematic circuit block diagram showing a preferred embodiment of delay PLL device according to the present invention.

Please refer to FIG. 3, which is a schematic circuit block diagram showing a preferred embodiment of delay PLL device according to the present invention. The delay PLL device includes a controlled delay circuit 31, a phase detector 32 and a control circuit 33. The controlled delay circuit 31 consists of four delay lines 311, 312, 313 and 314, each of which comprises a plurality of delay units (not shown). A reference clock signal CLK is transmitted through and processed by the four controlled delay lines 311, 312, 313 and 314 to generate the four output clock signals P1, P2, P3 and P0. In order to keep in phase with the reference clock signal CLK, the output clock signal P0 is transmitted to the phase detector 32 along with the reference clock signal CLK. If the phase detector 32 detects an earlier phase of the reference clock signal CLK than the output clock signal P0, a counting-down adjusting signal is asserted. On the contrary, i.e. the phase of the reference clock signal CLK is later than that of the output clock signal P0, a counting-up adjusting signal is asserted.

In response to the adjusting signal from the phase detector 32, the control circuit 33 outputs four counted values CNT0, CNT1, CNT2 and CNT3 to corresponding controlled delay lines 311, 312, 313 and 314 according to a distribution table. The counted values represent the involving numbers of delay units in the delay lines, respectively.

Please refer to FIG. 4 which illustrates an example of the distribution table. For example, when the total number of delay units required for delaying a reference clock signal by one cycle is indicated by a positive integer "m", where m=4n, it is apparent that all the counted values CNT0, CNT1, CNT2 and CNT3 are equal to "n". If a counting-up adjusting signal is asserted and the counted value is changed from "m" to "m+1", i.e. "4n+1", then only the counted value CNT2 is adjusted from "n" to "n+1", and the other counted values CNT0, CNT1 and CNT3 remain equal to "n". In another case that a counting-up adjusting signal is asserted and "m" becomes "m+2", i.e. "4n+2", both the counted values CNT1 and CNT3 are adjusted from "n" to "n+1", and the other counted values CNT0 and CNT2 remain unchanged. Further, if a counting-up adjusting signal is asserted and "m" becomes "m+3", i.e. "4n+3", then three of the counted values, i.e. CNT0, CNT1 and CNT3, are adjusted from "n" to "n+1", and the other counted value CNT2 is still equal to "n". In other words, different counted values in lieu of the only "m+4" adjustment can be used to relatively precisely tune the delay situation. Similarly, when a counting-down adjusting signal is asserted, "m−1", "m−2" and "m−3" in addition to "m−4" can be rendered according to the present invention. By this method, an optimal distribution can be obtained, as referring to FIG. 4, wherein the symbols sum0, sum 1, sum2 and sum3 represent the ideal delay situations for the four delay lines, and delta0, delta1, delta2 and delta3 represent the differences between real and ideal delay situations, respectively.

It is understood that the distribution table can be designed by the one skilled in the art according to the practical requirements.

Figure 1A:
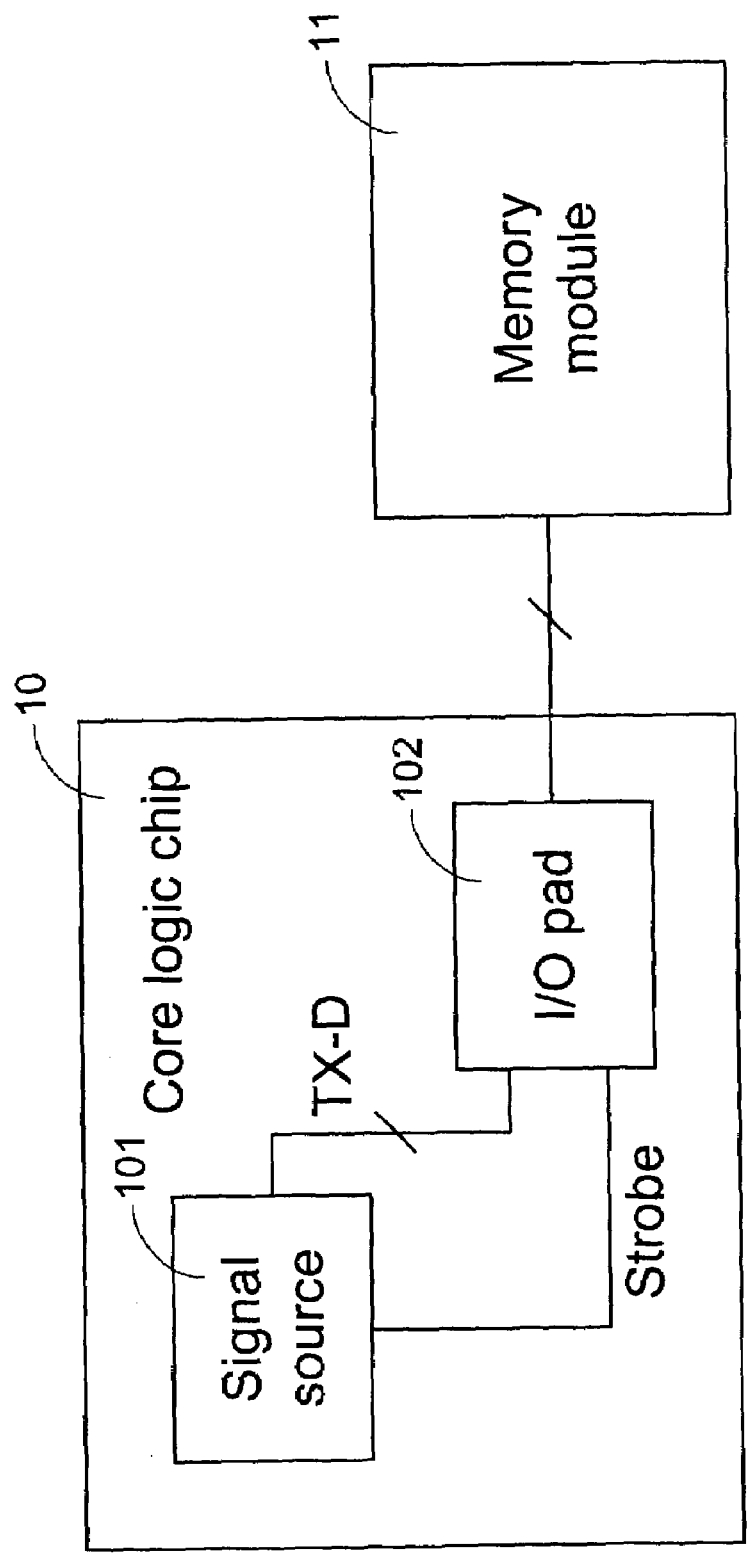
FIG. 1A is a schematic circuit block diagram showing the connection of a core logic chip and a memory module.
Figure 1B:
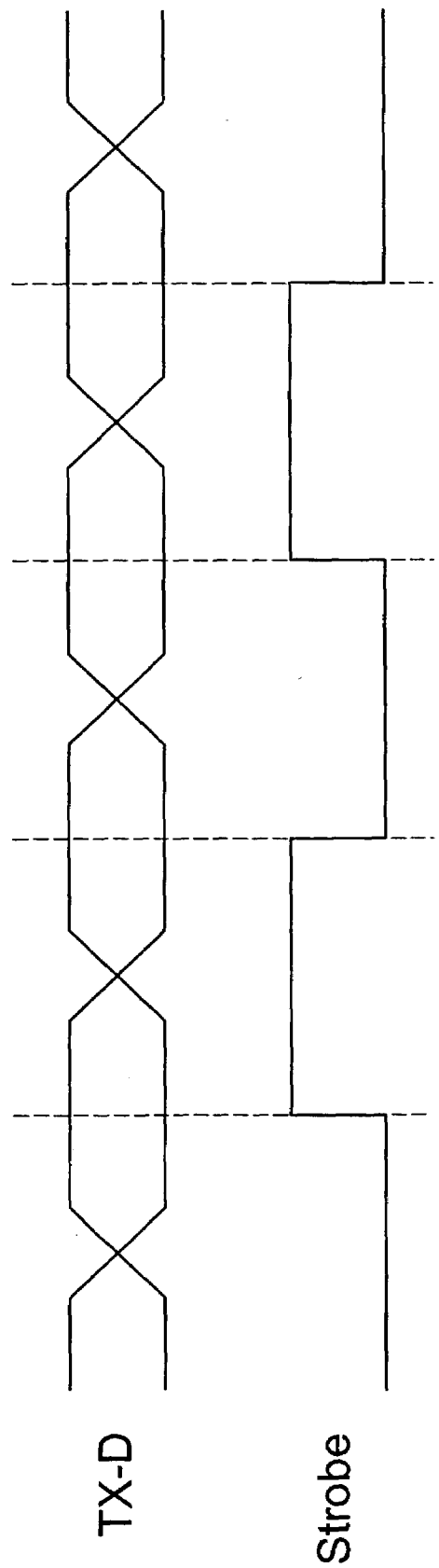
FIG. 1B is a schematic waveform diagram of strobe signal and TX_D signal according to double-data-rate (DDR) transmission specification.
Figure 2A:
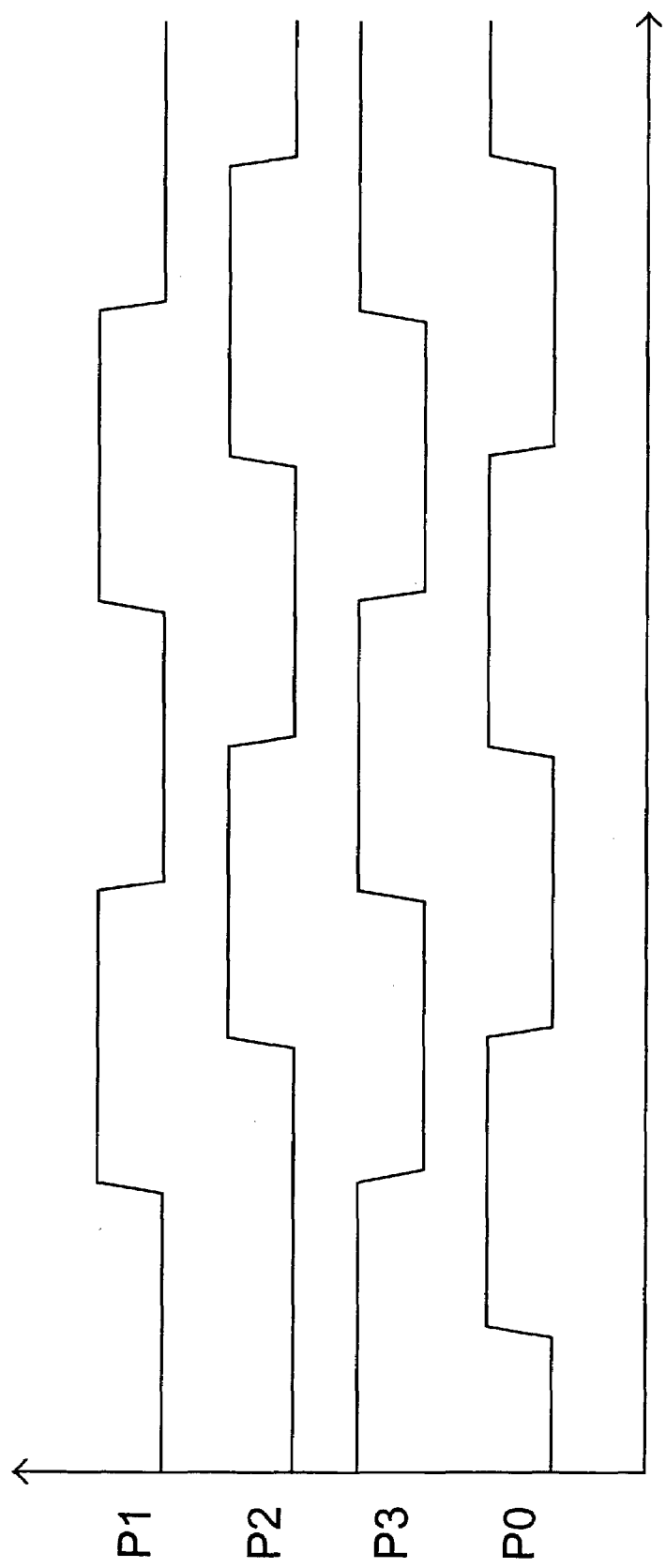
FIG. 2A is a schematic waveform diagram showing four output clock signals with a phase difference of 90 degrees between every two adjacent output clock signals.
Figure 2B:
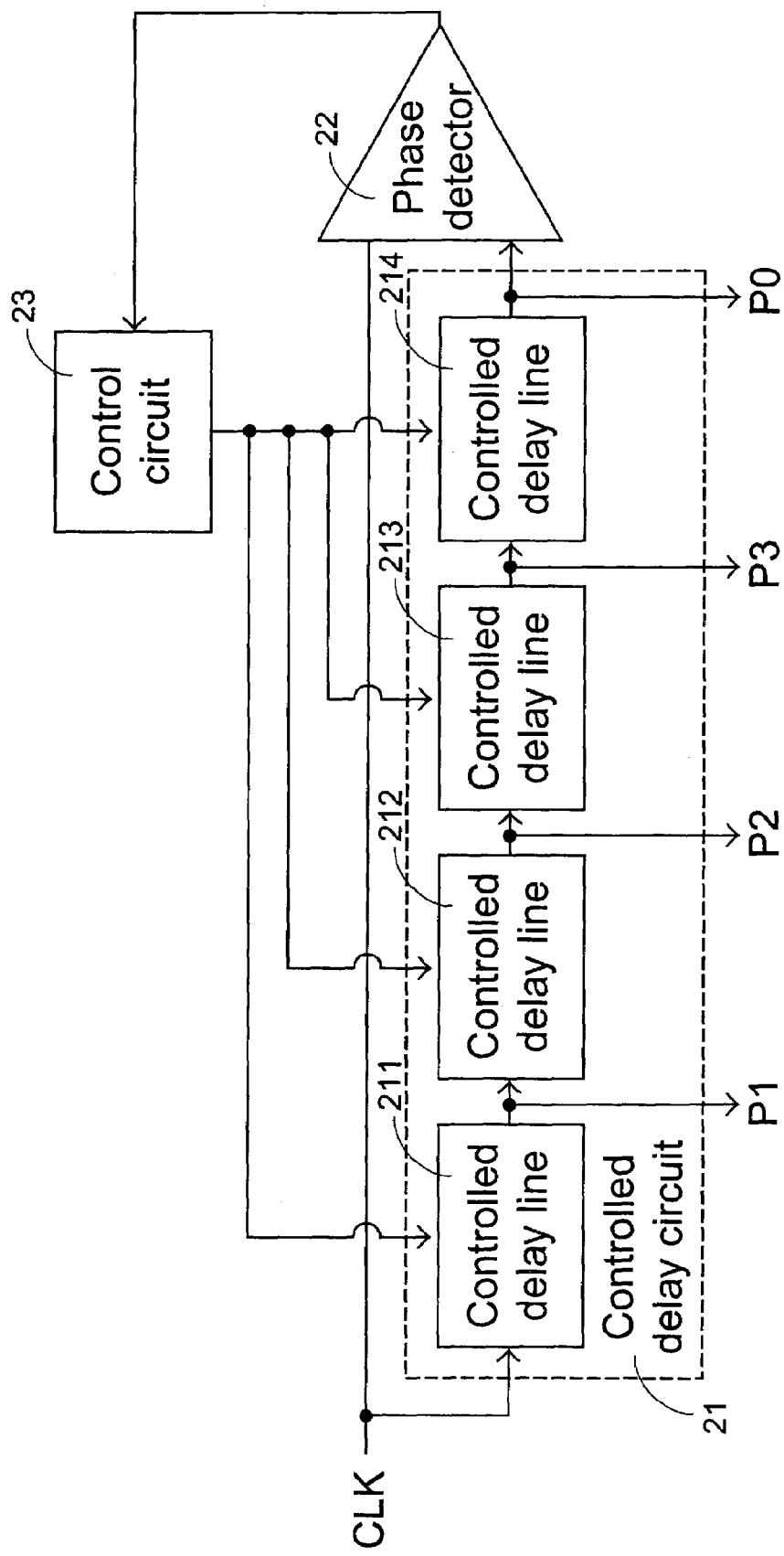
FIG. 2B is a schematic circuit block diagram showing a conventional delay PLL device.
Figure 2C:
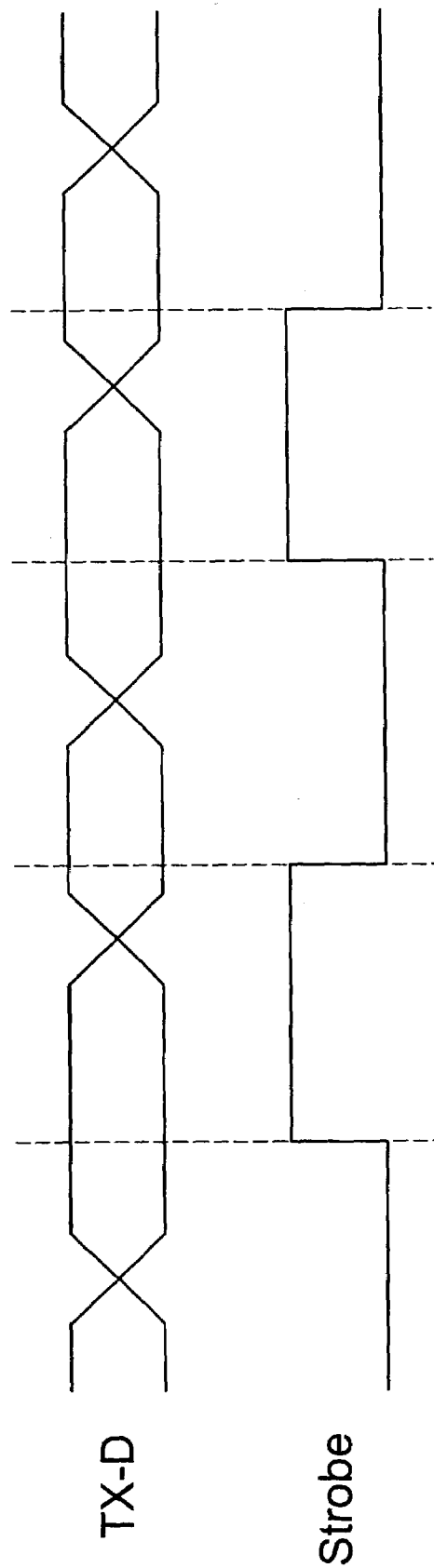
FIG. 2C is a schematic waveform diagram of strobe signal and TX_D signal according to double-date-rate (DDR) transmission specification by using a conventional method.
Figure 5A:
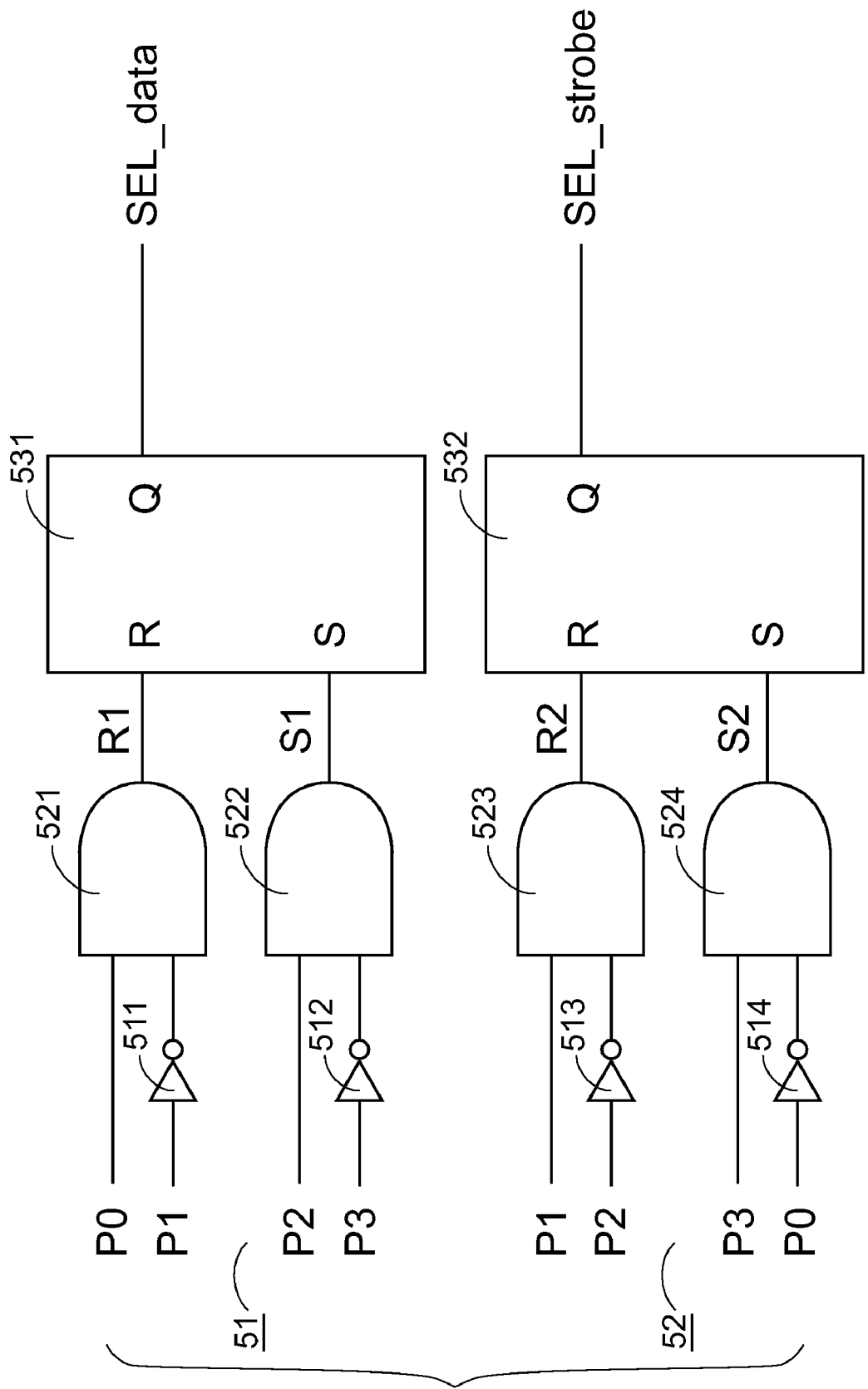
FIG. 5A is a schematic diagram of a logic circuit for generating SEL-data and SEL-strobe signals.
Figure 5B:
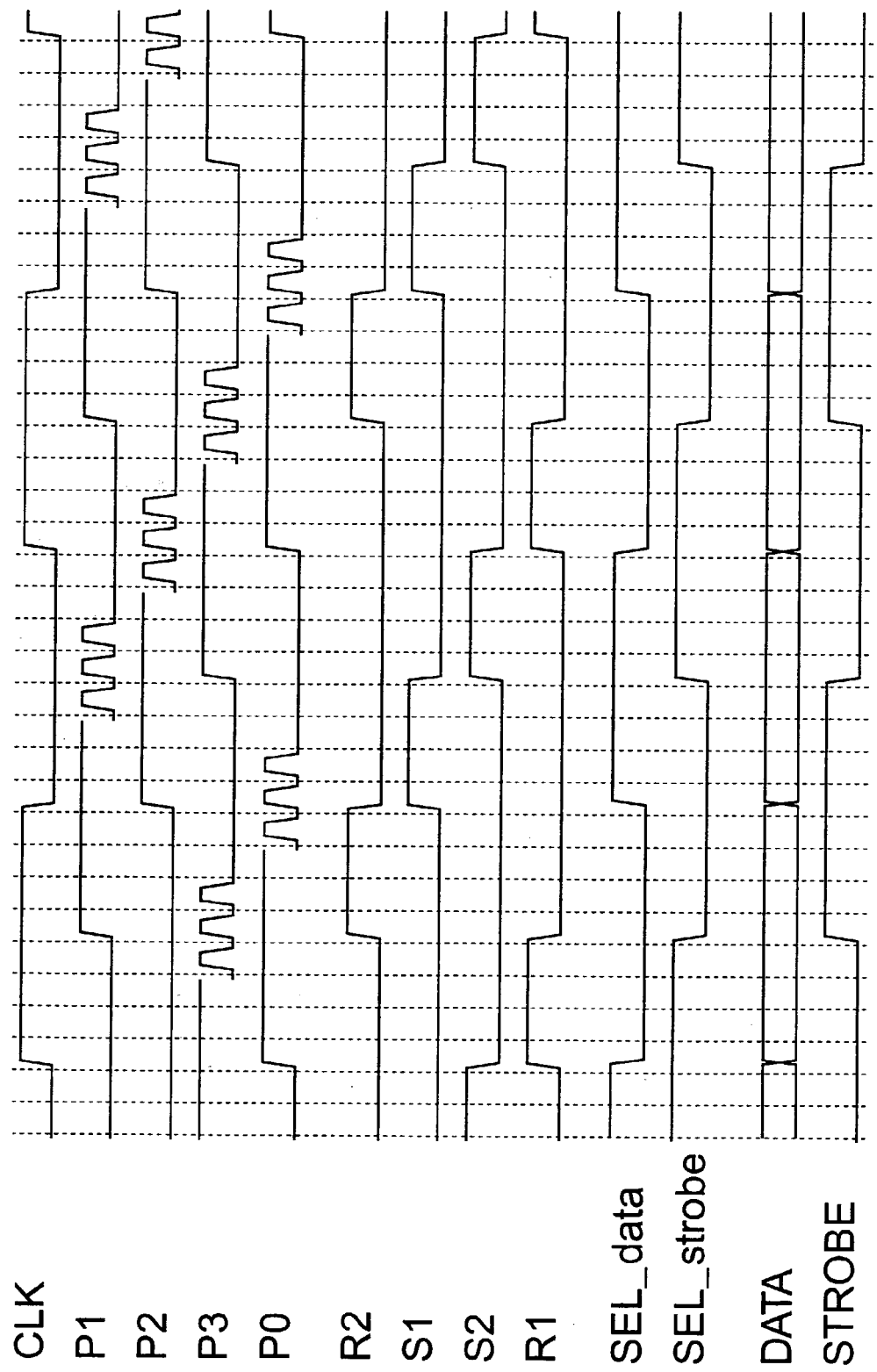
FIG. 5B is a schematic waveform diagram showing signals associated with the present invention.

The signals P1, P2, P3 and P0 generated by the delay PLL device according to the present invention are further processed by a logic circuit of FIG. 5A in order to obtain a SEL-data signal and a SEL-strobe signal. The logic circuit includes a first logic unit 51 and a second logic unit 52. In the first logic unit 51, the signals P1 and P3 are inverted by a first inverter 511 and a second inverter 512, respectively. The inverted signal P1 is then logically operated with the signal P0 via an AND gate 521 to obtain a first logic output R1 and the inverted signal P3 is then logically operated with the signal P2 via an AND gate 522 to obtain a second logic output S1. The logic outputs R1 and S1 serve as reset and set terminals of a first flip flop 531 to result in the SEL-data signal. Likewise, in the second logic unit 52, the signals P2 and P0 are inverted by a third inverter 513 and a fourth inverter 514, respectively. The inverted signal P2 is then logically operated with the signal P1 via an AND gate 523 to obtain a third logic output R2 and the inverted signal P0 is then logically operated with the signal P3 via an AND gate 524 to obtain a fourth logic output S2. The logic outputs R2 and S2 serve as reset and set terminals of a second flip flop 532 to result in the SEL-strobe signal. The SEL-data signal and the SEL-strobe signal are then referred to generate required data and strobe signals, as shown in FIG. 5B. It is to be noted that the SEL-data signal and the SEL-strobe signal are essentially dependent from the rising edges of the signals P1, P2, P3 and P0. In other words, the duty cycles of the signals P1, P2, P3 and P0 have nothing to do with the generation of the data signal and the strobe signal any longer, and thus the deviation as shown in FIG. 2C can be ignored.

In addition, by use of independently controlled delay lines, the delay skew and interference of different levels resulting from different transmission paths can be adjusted. Examples are given as follows with reference to FIGS. 6A~6C.

In a first example, the delay time for the delay lines are independently adjusted in order to provide longer data set-up time. Referring to FIG. 6A, the rising edges of the signals P1, P2, P3 and P0 are indicated by four downward arrows, respectively. Among the four signals, each of the first and the third ones is made to deviated from the quarter position. (90-degree distribution) by $\Delta t$ by inputting the differences $\Delta t0$, $\Delta t1$, $\Delta t2$ and $\Delta t3$ in FIG. 3 as $\Delta t$, $-\Delta t$, $\Delta t$ and $-\Delta t$, respectively. Accordingly, the counted values become:

$$CNT0 = m/4 + \Delta t$$

$$CNT1 = m/4 - \Delta t$$

$$CNT2 = m/4 + \Delta t; \text{ and}$$

$$CNT3 = m/4 - \Delta t.$$

Under this circumstance, the SEL-data signal, the SEL-strobe signal, the data signal and the strobe signal derived from the signals P1, P2, P3 and P0 will be also deviated from predetermined positions. The rising and falling edges of the strobe signal deviate from the middle of the data signal, and thus a longer set-up time of data is provided.

Figure 6B:
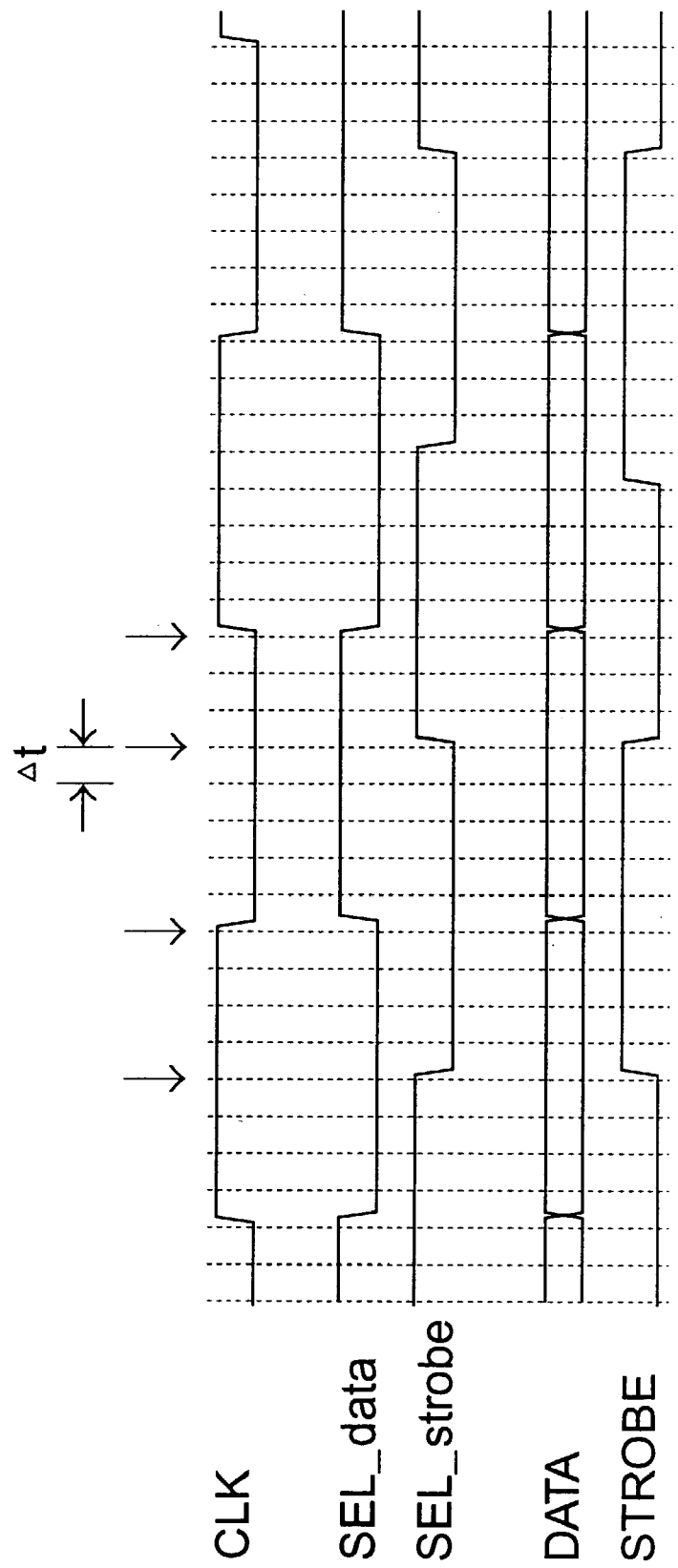

Please refer to FIG. 6B, a second example where the duty cycle of the strobe signal is changed from 50% is illustrated. In this example, the differences $\Delta t0$, $\Delta t1$, $\Delta t2$ and $\Delta t3$ in FIG. 3 are inputted as 0, 0, $\Delta t$ and $-\Delta t$, respectively. Accordingly, the counted values become:

$$CNT0 = m/4$$

$$CNT1 = m/4$$

$$CNT2 = m/4 + \Delta t; \text{ and}$$

$$CNT3 = m/4 - \Delta t.$$

The third signal P3 is deviated from the quarter position by $\Delta t$. As a result, it is apparent from FIG. 6B that the duty cycle of the strobe signal is not 50%.

Figure 6C:
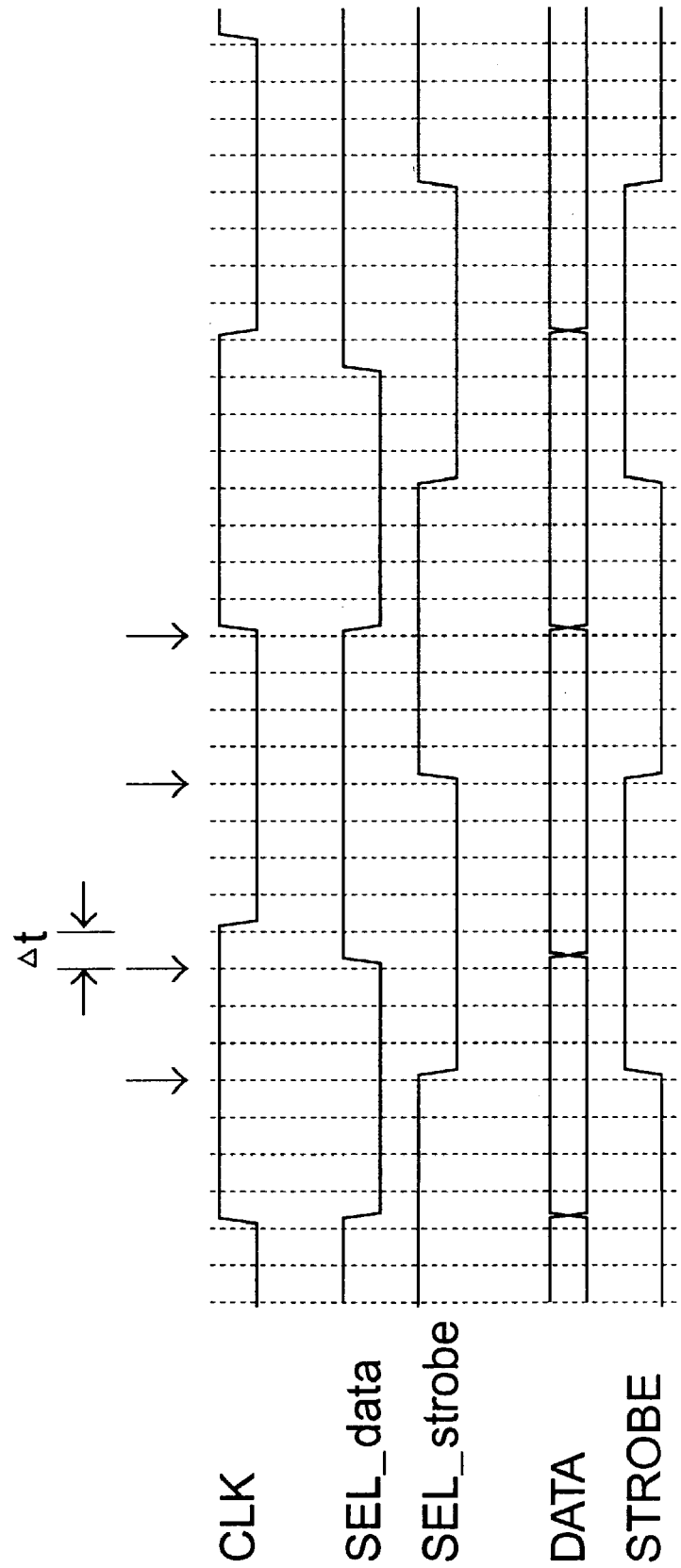

Please refer to FIG. 6C, a third example where the duty cycle of the SEL-data signal is changed from 50% is illustrated. In this example, the differences $\Delta t0$, $\Delta t1$, $\Delta t2$ and $\Delta t3$ in FIG. 3 are inputted as 0, $-\Delta t$, $\Delta t$ and 0, respectively. Accordingly, the counted values become:

$$CNT0 = m/4$$

$$CNT1 = m/4 - \Delta t$$

$$CNT2 = m/4 + \Delta t; \text{ and}$$

$$CNT3 = m/4.$$

The second signal P2 is ahead of the quarter position by $\Delta t$. As a result, it is apparent from FIG. 6C that the duty cycle of the SEL-data signal is not 50%.

According to the present invention, the delay lines 311, 312, 313 and 314 can be independently adjusted by inputting different time differences $\Delta t0$, $\Delta t1$, $\Delta t2$ and $\Delta t3$. As for the adjustment of $\Delta t0$, $\Delta t1$, $\Delta t2$ and $\Delta t3$, it can be implemented by precisely measuring the phase difference between each of the output clock signals and the reference clock signal CLK for each circuitry on the basis of the designs of the chipset and the main board. By this way, the time differences of the controlled delay lines, and thus the ideal delay distribution, i.e. the sum0, sum1, sum2 and sum3 in FIG. 4, can be determined.

By using the delay PLL device according to the present invention as a signal source, the data signal and strobe signal are modified from skew because the predicted different extents of skew resulting from passing through different transmission paths of the chip are adjusted in advance in the signal source. Therefore, the error possibility at the data-receiving end of the memory module can be efficiently diminished, so as to enhance the transmission rate.

The delay PLL device and the clock signal generating method according to the present invention can be applied to semiconductor circuit chips of various fields in addition to the core logic chip of a personal computer.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A core logic chip that transmits out a parallel data according to a strobe signal and a parallel data signal, comprising:
    a delay phase-locked loop (PLL) device for generating a plurality of output clock signals with different phases in response to a reference clock signal, comprising:
        a controlled delay circuit having a plurality of controlled delay lines interconnected in series and outputting therefrom a plurality of output clock signals;
        a phase detector electrically connected to an output end of said controlled delay circuit, and generating an adjusting signal according to a phase relation between said reference clock signal and one of said output clock signals; and
        a control circuit electrically connected to said phase detector and said controlled delay lines, and asserting a plurality of control signals to said controlled delay lines, respectively, in response to said adjusting signal in order to independently adjust the delay time of said output clock signals using said controlled delay lines, thereby obtaining four output signals P0, P1, P2 and P3 with different phases; and
    a logic circuit for logically operating said four output signals P0, P1, P2 and P3 to generate a SEL-data signal and a SEL-strobe signal, based on which said parallel data signal and said strobe signal are generated, said logic circuit comprising:
    a first inverter for inverting said output signal P1;
    a first AND gate for logically operating said output signal P0 and said inverted output signal P1 to obtain a first logic output R1;
    a second inverter for inverting said output signal P3;
    a second AND gate for logically operating said output signal P2 and said inverted output signal P3 to obtain a second logic output S1; and
    a first flip flop for outputting said SEL-data signal with said first logic output R1 and said second logic output S1 serving as reset and set terminals thereof, respectively.

2. The core logic chip according to claim 1, wherein each of said controlled delay lines consists of a plurality of delay units in series.

3. The core logic chip according to claim 1, wherein when said phase detector detects the phase of said one of said output clock signals is later than that of said reference clock signal, said adjusting signal is a delay-reduction adjusting signal; and when said phase detector detects the phase of said one of said output clock signals is earlier than that of said reference clock signal, said adjusting signal is a delay-extension adjusting signal.

4. The core logic chip according to claim 1, wherein when said control circuit receives said adjusting signal, said control circuit enables a partial portion of said controlled delay lines for delay time adjustment.

5. The core logic chip according to claim 1, wherein said delay circuit includes four delay lines for outputting four output clock signals according to four counted values, respectively, and said four counted values are independently adjusted by said control circuit.

6. The core logic chip according to claim 5, further comprising a distribution table referred by said control circuit to determine said counted values.

7. The core logic chip according to claim 5, wherein each of said plurality of controlled delay lines is precisely adjusted by a time period that depends on circuit design and layout of a hardware.

8. The core logic chip according to claim 1, wherein said logic circuit further includes:
a third inverter for inverting said output signal P2;
a third AND gate for logically operating said output signal P1 and said inverted output signal P2 to obtain a third logic output R2;
a fourth inverter for inverting said output signal P0;
a fourth AND gate for logically operating said output signal P3 and said inverted output signal P0 to obtain a fourth logic output S2; and
a second flip flop for outputting said SEL-strobe signal with said third logic output R2 and said fourth logic output S2 serving as reset and set terminals thereof, respectively.

9. A core logic chip that transmits out a parallel data according to a strobe signal and a parallel data signal, comprising:
a delay phase-locked loop (PLL) device for generating a plurality of output clock signals with different phases in response to a reference clock signal, comprising:
a controlled delay circuit having a plurality of controlled delay lines interconnected in series and outputting therefrom a plurality of output clock signals;
a phase detector electrically connected to an output end of said controlled delay circuit, and generating an adjusting signal according to a phase relation between said reference clock signal and one of said output clock signals; and
a control circuit electrically connected to said phase detector and said controlled delay lines, and asserting a plurality of control signals to said controlled delay lines, respectively, in response to said adjusting signal in order to independently adjust the delay time of said output clock signals using said controlled delay lines, thereby obtaining four output signals P0, P1, P2 and P3 with different phases; and
a logic circuit for logically operating said four output signals P0, P1, P2 and P3 to generate a SEL-data signal and a SEL-strobe signal, based on which said parallel data signal and said strobe signal are generated, said logic circuit comprising:
a first inverter for inverting said output signal P2;
a first AND gate for logically operating said output signal P1 and said inverted output signal P2 to obtain a first logic output R2;
a second inverter for inverting said output signal P0; a second AND gate for logically operating said output signal P3 and said inverted output signal P0 to obtain a second logic output S2; and
a first flip flop for outputting said SEL-strobe signal with said first logic output R2 and said second logic output S2 serving as reset and set terminals thereof, respectively.

10. The core logic chip according to claim 9, wherein each of said controlled delay lines consists of a plurality of delay units in series.

11. The core logic chip according to claim 9, wherein when said phase detector detects the phase of said one of said output clock signals is later than that of said reference clock signal, said adjusting signal is a delay-reduction adjusting signal; and when said phase detector detects the phase of said one of said output clock signals is earlier than that of said reference clock signal, said adjusting signal is a delay-extension adjusting signal.

12. The core logic chip according to claim 9, wherein when said control circuit receives said adjusting signal, said control circuit enables a partial portion of said controlled delay lines for delay time adjustment.

13. The core logic chip according to claim 9, wherein said delay circuit includes four delay lines for outputting four output clock signals according to four counted values, respectively, and said four counted values are independently adjusted by said control circuit.

14. The core logic chip according to claim 13, further comprising a distribution table referred by said control circuit to determine said counted values.

15. The core logic chip according to claim 13, wherein each of said plurality of controlled delay lines is precisely adjusted by a time period that depends on circuit design and layout of a hardware.

* * * * *